(12) United States Patent
Tsuzuki et al.

(10) Patent No.: US 11,385,330 B2
(45) Date of Patent: Jul. 12, 2022

(54) PHOTOELECTRIC SENSOR AND LIGHT EMITTER WITH ABNORMALITY DETECTION

(71) Applicants: OMRON Corporation, Kyoto (JP); TOYOTA JIDOSHA KABUSHIKI KAISHA, Toyota (JP)

(72) Inventors: Ryosuke Tsuzuki, Ayabe (JP); Takuya Okamoto, Ayabe (JP); Yukiharu Tomita, Toyota (JP)

(73) Assignees: OMRON Corporation, Kyoto (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 322 days.

(21) Appl. No.: 16/482,720

(22) PCT Filed: Nov. 16, 2017

(86) PCT No.: PCT/JP2017/041301
§ 371 (c)(1),
(2) Date: Aug. 1, 2019

(87) PCT Pub. No.: WO2018/146893
PCT Pub. Date: Aug. 16, 2018

(65) Prior Publication Data
US 2021/0286052 A1 Sep. 16, 2021

(30) Foreign Application Priority Data
Feb. 10, 2017 (JP) .............................. JP2017-023651

(51) Int. Cl.
*G01S 17/04* (2020.01)
*G01S 7/481* (2006.01)
*G01N 21/84* (2006.01)

(52) U.S. Cl.
CPC ............ *G01S 7/4812* (2013.01); *G01S 17/04* (2020.01); *G01N 21/84* (2013.01); *G01N 2021/845* (2013.01)

(58) Field of Classification Search
CPC .. H03K 17/941; H03K 17/133; H03K 17/795; H03K 2217/94104; H01H 35/00;
(Continued)

(56) References Cited

U.S. PATENT DOCUMENTS 5,532,472 A  7/1996 Furuta
9,044,149 B2 * 6/2015 Richards .............. A61B 5/0002
(Continued)

FOREIGN PATENT DOCUMENTS

CN  101714812 A  5/2010
CN  102207554 A  10/2011
(Continued)

OTHER PUBLICATIONS

The Office Action (CNOA) dated Sep. 28, 2020 in a counterpart Chinese patent application.
(Continued)

*Primary Examiner* — Que Tan Le
(74) *Attorney, Agent, or Firm* — Metrolex IP Law Group, PLLC

(57) ABSTRACT

A photoelectric sensor including a light emitter and a light receiver is provided. The light emitter includes a light emitting unit configured to emit a light beam, and a power supply circuit configured to receive supply of electric power through a first power supply line leading to an outside of the light emitter and to supply required electric power to the light emitting unit. The light receiver includes: a first switching element, the first switching element serving to output a first output signal; a second switching element serving to output a second output signal; and a detection circuit. A third
(Continued)

power supply line is provided such that one end of the third power supply line is electrically connected to the first power supply line inside the light emitter, and the other end is electrically connected to the second power supply line outside the light receiver.

16 Claims, 8 Drawing Sheets

(58) Field of Classification Search
CPC .......... G01S 17/04; G01S 17/06; G01S 17/42; G01S 17/481; G01S 17/4811; G01V 8/20; G01V 8/12
USPC .......................... 250/214 R, 214.1, 221, 205
See application file for complete search history.

(56) References Cited

U.S. PATENT DOCUMENTS

| | | |
|---|---|---|
| 2005/0094920 A1 | 5/2005 | Kamei et al. |
| 2008/0180667 A1 | 7/2008 | Okuno |
| 2010/0084543 A1 | 4/2010 | Hou |
| 2011/0226938 A1 | 9/2011 | Tagashira |
| 2014/0028436 A1 | 1/2014 | Osako et al. |

FOREIGN PATENT DOCUMENTS

| | | |
|---|---|---|
| CN | 103404029 A | 11/2013 |
| EP | 2677659 A1 | 12/2013 |
| JP | H07-114819 A | 5/1995 |
| JP | H07-302530 A | 11/1995 |
| JP | H10-092279 A | 4/1998 |
| JP | 2003-298401 A | 10/2003 |
| JP | 2004-317511 A | 11/2004 |
| JP | 2009-98735 A | 5/2009 |
| JP | 2012-170016 A | 9/2012 |
| JP | 2015-153461 A | 8/2015 |

OTHER PUBLICATIONS

The extended European search report (EESR) dated Nov. 23, 2020 in a counterpart European patent application.
An English translation of the International Search Report("ISR") of PCT/JP2017/041301 dated Feb. 20, 2018.
The Written Opinion("WO") of PCT/JP2017/041301 dated Feb. 20, 2018.
The International Preliminary Report On Patentability (IPRP) Chapter II of the Patent Cooperation Treaty of PCT/JP2017/041301 dated Feb. 26, 2019.

* cited by examiner

FIG.4

| NORMAL/ABNORMAL | DETECTION TARGET | LOAD ON OUT1 | LOAD ON OUT2 | |
|---|---|---|---|---|
| NORMAL | NOT EXIST | Hi | Low | |
| | EXIST | Low | Hi | |
| (A) POWER SUPPLY LINE OF LIGHT RECEIVER DISCONNECTED | NOT EXIST | Low | Low | |
| | EXIST | Low | Low | |
| (B) GROUND LINE OF LIGHT RECEIVER DISCONNECTED | NOT EXIST | Low | Low | |
| | EXIST | Low | Low | |
| (C) OUT1 LINE DISCONNECTED | NOT EXIST | Low | Low | DETECT ABNORMALITY WHEN DETECTION STATE CHANGES |
| | EXIST | Low | Hi | |
| (D) OUT2 LINE DISCONNECTED | NOT EXIST | Hi | Low | |
| | EXIST | Low | Low | |
| (E) POWER SUPPLY LINE OF LIGHT EMITTER DISCONNECTED | NOT EXIST | Low | Hi | UNABLE TO DETECT ABNORMALITY EVEN WHEN DETECTION STATE CHANGES |
| | EXIST | Low | Hi | |
| (F) GROUND LINE OF LIGHT EMITTER DISCONNECTED | NOT EXIST | Low | Hi | |
| | EXIST | Low | Hi | |

PRESENT EMBODIMENT

FIG.6

| NORMAL/ABNORMAL | DETECTION TARGET | LOAD ON OUT1 | LOAD ON OUT2 | |
|---|---|---|---|---|
| NORMAL | NOT EXIST | Hi | Low | |
| | EXIST | Low | Hi | |
| (A) POWER SUPPLY LINE OF LIGHT RECEIVER DISCONNECTED | NOT EXIST | Low | Low | |
| | EXIST | Low | Low | |
| (B) GROUND LINE OF LIGHT RECEIVER DISCONNECTED | NOT EXIST | Low | Low | |
| | EXIST | Low | Low | |
| (C) OUT1 LINE DISCONNECTED | NOT EXIST | Low | Low | ⎫ DETECT ABNORMALITY WHEN DETECTION STATE CHANGES |
| | EXIST | Low | Hi | |
| (D) OUT2 LINE DISCONNECTED | NOT EXIST | Hi | Low | |
| | EXIST | Low | Low | |
| (E) POWER SUPPLY LINE OF LIGHT EMITTER DISCONNECTED | NOT EXIST | Low | Low | ⎫ ABLE TO DETECT ABNORMALITY BY LINE DISCONNECTION IN LIGHT EMITTER |
| | EXIST | Low | Low | |
| (F) GROUND LINE OF LIGHT EMITTER DISCONNECTED | NOT EXIST | Low | Low | |
| | EXIST | Low | Low | |
| (G) SECONDARY POWER SUPPLY LINE OF LIGHT EMITTER DISCONNECTED | NOT EXIST | Low | Low | |
| | EXIST | Low | Low | |

PRESENT EMBODIMENT (FIRST MODIFICATION)

PRESENT EMBODIMENT (SECOND MODIFICATION)

PHOTOELECTRIC SENSOR AND LIGHT EMITTER WITH ABNORMALITY DETECTION

TECHNICAL FIELD

The present invention relates to a transmission-type photoelectric sensor and a light emitter included in the photoelectric sensor.

BACKGROUND ART

As an example of a sensor for detecting existence and invasion of an object, a photoelectric sensor is known. A photoelectric sensor includes: a light emitting unit configured to emit a light beam; and a light receiving unit configured to detect that the emitted light beam has changed due to a detection target. The photoelectric sensor is classified roughly into a transmission type, a reflection type, a distance-setting type, and the like. Among them, in a reflection-type photoelectric sensor and a distance-setting-type photoelectric sensor, a light emitting unit and a light receiving unit are disposed approximately at the same position. In contrast, in a transmission-type photoelectric sensor, a light emitting unit and a light receiving unit are spaced apart from each other.

Various types of sensors each including a photoelectric sensor each serve as a key device for implementing factory automation (FA). Based on the detection results from various types of sensors, the behaviors of various types of devices and facilities are controlled. Also, some defects may occur in various types of sensors. In such a case, occurrence of such defects needs to be detected.

For example, Japanese Patent Laying-Open No. 2009-098735 (PTL 1) discloses a slave of a PLC, by which an abnormality in a photoelectric sensor can be detected in real time while reducing the burden on a user program on the PLC side for executing a sensor abnormality diagnosing method utilizing a function of changing the amount of emitted light beam in a sensing system in which a plurality of transmission-type photoelectric sensors are connected to a PLC through the slave. More specifically, the sensor abnormality diagnosing means mounted in the slave of the PLC disclosed in PTL 1 is configured to change the amount of emitted light beam and detect an abnormality in a photoelectric sensor based on the relation of the amount of light beam received at that time.

CITATION LIST

Patent Literature

PTL 1: Japanese Patent Laying-Open No. 2009-098735

SUMMARY OF INVENTION

Technical Problem

In the configuration disclosed in PTL 1 mentioned above, sensor abnormality diagnosing means needs to be mounted in the slave of the PLC, which is suitable when a large number of transmission-type photoelectric sensors are connected through a single slave, but is not advantageous in terms of cost when a transmission-type photoelectric sensor is connected alone.

An object of the present invention is to implement a transmission-type photoelectric sensor configured to allow detection of an abnormality in a simple configuration.

Solution to Problem

According to an aspect of the present invention, a photoelectric sensor including a light emitter and a light receiver that are separated from each other is provided. The light emitter includes: a light emitting unit configured to emit a light beam, and a power supply circuit configured to receive supply of electric power through a first power supply line leading to an outside of the light emitter and to supply required electric power to the light emitting unit. The light receiver includes: a first switching element, connected to a second power supply line leading to an outside of the light receiver, for serving to output a first output signal; a second switching element, connected to the second power supply line, for serving to output a second output signal; and a detection circuit configured to switch a conducting state of each of the first switching element and the second switching element in accordance with an intensity of light detected. A third power supply line is provided such that one end of the third power supply line is electrically connected to the first power supply line inside the light emitter and the other end of the third power supply line is electrically connected to the second power supply line outside the light receiver.

Preferably, the light emitter further includes a third switching element disposed between the one end of the third power supply line and the first power supply line, and a monitoring circuit configured to control a conducting state of the third switching element.

Further preferably, the monitoring circuit is configured to operate with electric power supplied through the first power supply line.

Further preferably, the light emitter further includes a detector configured to monitor a state of the light beam applied from the light emitting unit. The monitoring circuit is configured to maintain the third switching element in the conducting state when the light beam is applied in a predetermined state.

Preferably, the photoelectric sensor further includes a connection unit through which electric power is input from an external power supply and through which the first output signal and the second output signal are output. The first power supply line extends from the light emitter to the connection unit. The second power supply line extends from the light receiver to the connection unit.

According to another aspect of the present invention, a light emitter combined with a light receiver to form a photoelectric sensor is provided. The light emitter and the light receiver are separated from each other. The light emitter includes: a light emitting unit configured to emit a light beam; and a power supply circuit configured to receive supply of electric power through a first power supply line leading to an outside of the light emitter and to supply required electric power to the light emitting unit. The light receiver includes: a first switching element, connected to a second power supply line leading to an outside of the light receiver, for serving to output a first output signal; a second switching element, connected to the second power supply line, for serving to output a second output signal; and a detection circuit configured to switch a conducting state of each of the first switching element and the second switching element in accordance with an intensity of light detected. A third power supply line is provided such that one end of the third power supply line is electrically connected to the first power supply line inside the light emitter, and the other end of the third power supply line is electrically connected to the second power supply line outside the light receiver.

Advantageous Effects of Invention

The present invention can implement a transmission-type photoelectric sensor that is capable of detecting an abnormality in a simple configuration.

BRIEF DESCRIPTION OF DRAWINGS

FIG. 4 is a diagram showing changes in output signals at the time when disconnection occurs in the photoelectric sensor according to the related art of the present invention.

FIG. 6 is a diagram showing changes in output signals at the time when disconnection occurs in the photoelectric sensor according to the present embodiment.

DESCRIPTION OF EMBODIMENTS

Figure 1:
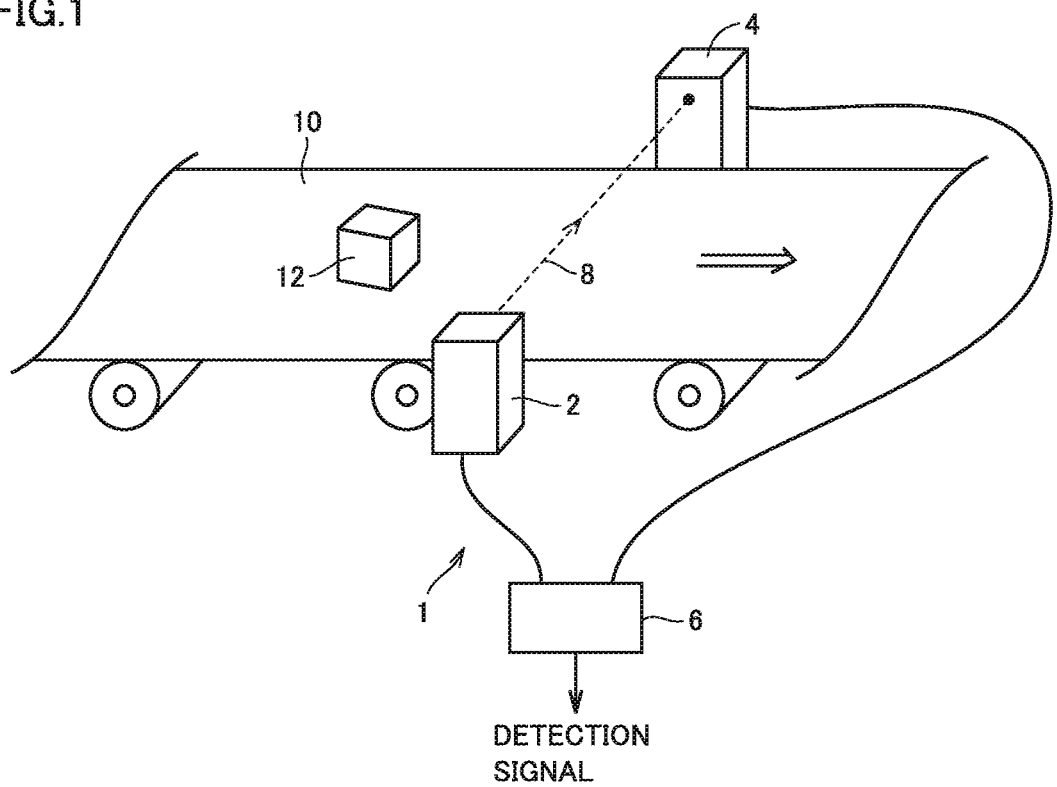
FIG. 1 is a schematic diagram showing the state where a transmission-type photoelectric sensor according to the present embodiment is disposed.

The embodiments of the present invention will be hereinafter described in detail with reference to the accompanying drawings, in which the same or corresponding components are designated by the same reference characters, and description thereof will not be repeated.

A. Application Example of Photoelectric Sensor

First, an application example of a transmission-type photoelectric sensor 1 according to the present embodiment will be hereinafter described.

FIG. 1 is a schematic diagram showing the state where transmission-type photoelectric sensor 1 according to the present embodiment is disposed. FIG. 1 shows an example of detecting: a workpiece 12 that is conveyed on a conveyor 10. More specifically, photoelectric sensor 1 includes a light emitter 2, a light receiver 4, and a controller 6. Light emitter 2 and light receiver 4 excluding controller 6 may also be referred to as a "photoelectric sensor". Light emitter 2 and light receiver 4 are separated from each other and disposed such that light receiver 4 receives a light beam 8 emitted from light emitter 2. In other words, light emitter 2 and light receiver 4 are provided as separate housings.

When workpiece 12 interrupts the light beam from light emitter 2, the state of light receiver 4 receiving the light beam (the amount of detected light beam) changes. Then, based on this change, the presence or absence of workpiece 12 can be detected.

Controller 6 may issue commands for controlling the timing and the state for applying light beam 8 from light emitter 2, as will be described later.

B. Configuration of Photoelectric Sensor

Figure 2:
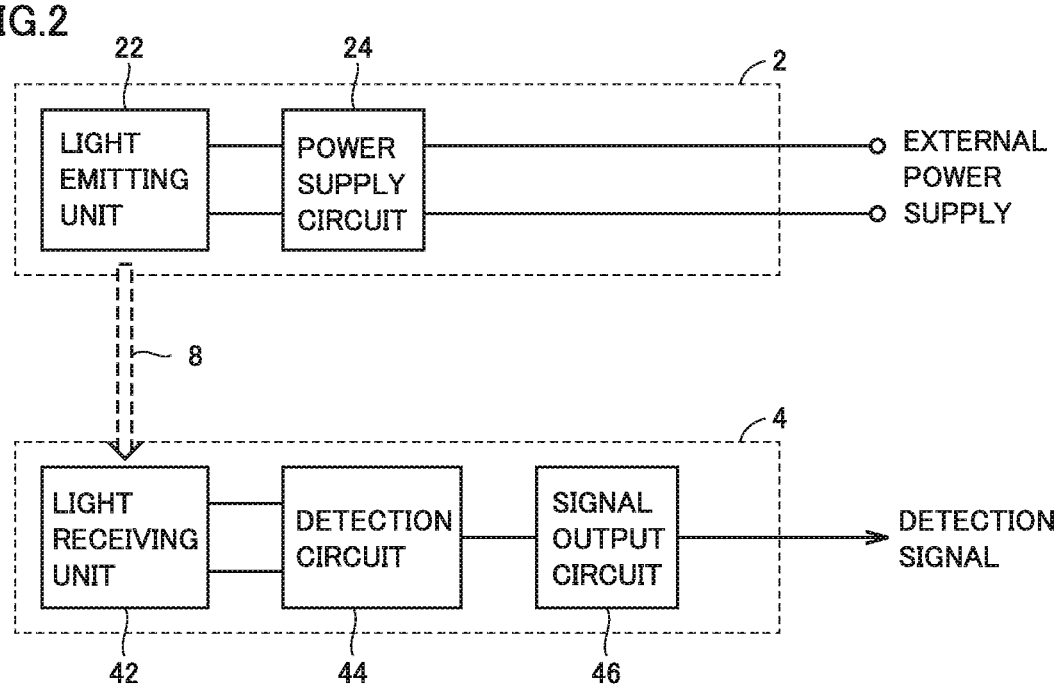
FIG. 2 is a schematic diagram showing the configuration of the transmission-type photoelectric sensor according to the present embodiment.

Then, the configuration of transmission-type photoelectric sensor 1 according to the present embodiment will be described. FIG. 2 is a schematic diagram showing the configuration of transmission-type photoelectric sensor 1 according to the present embodiment.

Referring to FIG. 2, light emitter 2 of photoelectric sensor 1 includes a light emitting unit 22 and a power supply circuit 24. Power supply circuit 24 receives electric power supplied from an external power supply and supplies required electric power of a prescribed voltage to light emitting unit 22. Light emitting unit 22 is for example formed of a light emitting element such as a light emitting diode (LED), a lens and the like, and configured to emit light beam 8 to be applied to a detection target.

Light receiver 4 of photoelectric sensor 1 includes a light receiving unit 42, a detection circuit 44, and a signal output circuit 46. Light receiving unit 42 is formed of a light receiving element such as a photodiode. When light receiving unit 42 receives light beam 8 from light emitter 2, it outputs a signal in accordance with the intensity of received light beam 8. In response to the signal from light receiving unit 42, detection circuit 44 outputs a signal appropriate to the light-beam incident state and/or the light-beam interrupted state. In response to the signal from light receiving unit 42, signal output circuit 46 outputs a detection signal to controller 6 (FIG. 1) and the like.

C. Wiring Configuration and Problem Caused Thereby

The following is an explanation about the wiring configuration of a photoelectric sensor 101 according to the related art of the present invention together with a problem caused by the wiring configuration.

Figure 3:
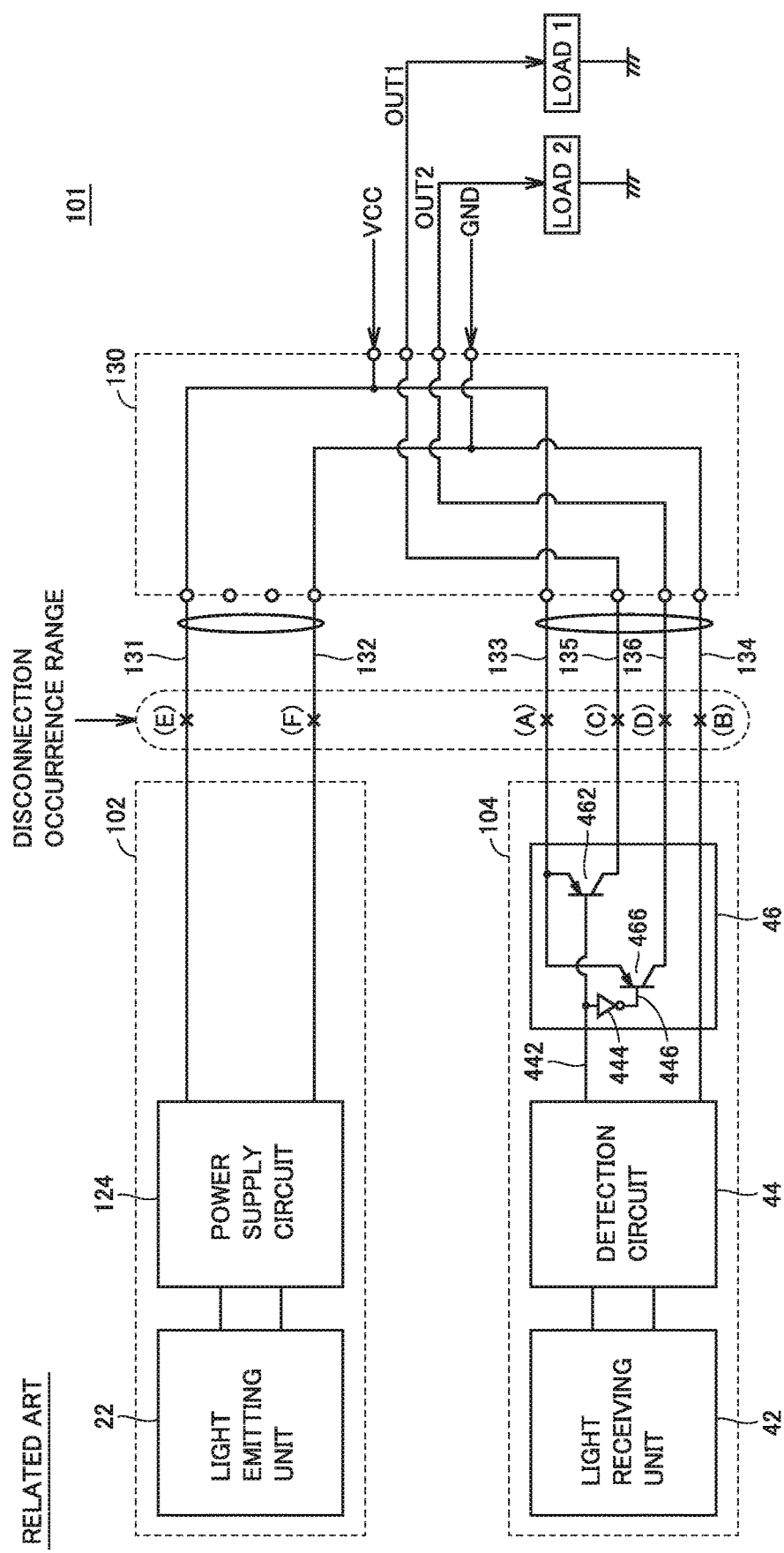
FIG. 3 is a schematic diagram showing an example of the wiring configuration of a photoelectric sensor according to the related art of the present invention.

FIG. 3 is a schematic diagram showing an example of the wiring configuration of photoelectric sensor 101 according to the related art of the present invention. Referring to FIG. 3, photoelectric sensor 101 according to the related art of the present invention includes a light emitter 102 and a light receiver 104, each of which supplies electric power and outputs a signal through a connection unit 130. Specifically, electric power is input to connection unit 130 from an external power supply while output signals OUT1 and OUT2 (the first output signal and the second output signal) are output from connection unit 130.

Light emitting unit 22 of light emitter 102 is substantially the same as light emitting unit 22 of light emitter 2 in photoelectric sensor 1. Light receiving unit 42, detection circuit 44 and signal output circuit 46 of light receiver 104 are substantially the same as light receiving unit 42, detection circuit 44 and signal output circuit 46, respectively, of light receiver 4. Power supply circuit 124 of light emitter 102 receives electric power supplied from an external power supply, and supplies electric power of a prescribed voltage to light emitting unit 22.

Each of photoelectric sensor 101 according to the related art of the present invention and photoelectric sensor 1 according to the present embodiment (which will be described later in detail) outputs two signals as detection signals. By using such two signals, any defect that may occur in light receiver 104 and light receiver 4 can be detected. A method of detecting such a defect will be described later in detail.

In the wiring configuration of light emitter 102, a power supply potential VCC supplied to connection unit 130 is connected to one end of power supply circuit 124 of light emitter 102 through power supply line 131, and a ground potential GND supplied to connection unit 130 is connected to the other end of power supply circuit 124 of light emitter 102 through a ground line 132.

In the wiring configuration of light receiver 104, power supply potential VCC supplied to connection unit 130 is connected to one end of signal output circuit 46 of light receiver 104 through power supply line 133, and ground potential GND supplied to connection unit 130 is connected to the other end of signal output circuit 46 of light receiver 104 through ground line 134.

Although not shown, the electric power supplied through power supply line 133 and ground line 134 may be supplied to detection circuit 44. In this case, a power supply circuit that is not shown is also connected to power supply line 133 and ground line 134.

A transistor 462 and a transistor 466 are connected in parallel with power supply potential VCC supplied to signal output circuit 46.

Transistor 462 has one end connected to a first signal line 135. The electric potential appearing on first signal line 135 is defined as an output signal OUT1. In other words, transistor 462 corresponds to the first switching element connected to power supply line 133 (the second power supply line) leading to the outside of light receiver 104 and serving to output the output signal OUT1 (the first output signal).

Similarly, transistor 466 has one end connected to second signal line 136. The electric potential appearing on second signal line 136 is defined as an output signal OUT2. In other words, transistor 466 corresponds to the second switching element connected to power supply line 133 (the second power supply line) leading to the outside of light receiver 104 and serving to output the output signal OUT2 (the second output signal).

The following is an example regarding photoelectric sensor 1 according to the present embodiment, in which the values inverted from each other are output as two output signals in accordance with the intensity of light. In other words, two signals inverted from each other are output as detection signals.

Transistor 462 has a gate to which a drive line 442 from detection circuit 44 is connected. Transistor 466 has a gate to which a drive line 446 connected to drive line 442 through an inverting circuit 444 is input. Detection circuit 44 drives drive line 442 in response to the detection signal from light receiving unit 42. Drive line 446 is connected to the output of inverting circuit 444 to which drive line 442 is input. Accordingly, drive line 442 and drive line 446 are driven complementarily to each other. By way of example, when a prescribed amount of received light is detected by light receiving unit 42, drive line 442 is activated while drive line 446 is deactivated. On the other hand, when a prescribed amount of received light is not detected by light receiving unit 42, drive line 442 is deactivated while drive line 446 is activated. In this way, one drive line is activated while the other drive line is deactivated. In other words, in accordance with the intensity of the detected light, detection circuit 44 switches transistor 462 (the first switching element) and transistor 466 (the second switching element) so as to be brought into conducting states different from each other.

In this way, in accordance with the intensity of the detected light, detection circuit 44 switches the conducting state of each of transistor 462 (the first switching element) and transistor 466 (the second switching element).

By employing such an output logic, for example, when output signal OUT1 is at (in an active state/at a high potential) in the state where a prescribed amount of received light is detected by light receiving unit 42, output signal OUT2 is at Low (in a non-active state/at a low potential). On the other hand, when a prescribed amount of received light is not detected by light receiving unit 42, output signal OUT1 is at Low and output signal OUT2 is at Hi.

In addition, the relation of the amount of received light with output signal OUT1 and output signal OUT2 may be opposite. Specifically, when output signal OUT1 is at Low (in a non-active state/at a low potential) in the state where a prescribed amount of received light is detected by light receiving unit 42, output signal OUT2 is at Hi (in an active state/at a high potential).

In controller 6 (see FIG. 1), occurrence or non-occurrence of an abnormality can be detected based on the combination of the value of output signal OUT1 and the value of output signal OUT2.

Light emitter 102 and light receiver 104 may be connected through a terminal provided in connection unit 130. The configuration formed by connecting a plurality of cables may be employed as a cable that connects connection unit 130 and light emitter 102 and/or a cable that connects connection unit 130 and light receiver 104. In such a case, connection is achieved through optional connectors between a cable and connection unit 130, between cables, and between a cable and light emitter 102 or light receiver 104.

In the wiring configuration as described above, there is a possibility that disconnection may occur in a conductive wire that connects connection unit 130 and tight emitter 102 or light receiver 104. In particular, as the distance from connection unit 130 is longer, the possibility of occurrence of disconnection becomes higher.

The following is an explanation about the function of detecting disconnection in photoelectric sensor 101 shown in FIG. 3. FIG. 4 is a diagram showing changes in output signals at the time when disconnection occurs in photoelectric sensor 101 according to the related art of the present invention. FIG. 4 shows the output results of output signal OUT1 and output signal OUT2 in the state where a detection target does not exist (the light-beam incident state) and the state where a detection target exists (the light-beam interrupted state) with regard to each of: the normal state where no disconnection occurs; (A) the case where power supply line 133 of light receiver 104 is disconnected; (B) the case where ground line 134 of light receiver 104 is disconnected; (C) the case where first signal line 135 is disconnected; (D) the case where second signal line 136 is disconnected; (E) the case where power supply line 131 of light emitter 102 is disconnected; and (F) the case where ground line 132 of light emitter 102 is disconnected.

In the normal state where no disconnection occurs, output signal OUT1 is at Hi and output signal OUT2 is at Low when a detection target does not exist (the light-beam incident state: no detection target exists), whereas output signal OUT1 is at Low and output signal OUT2 is at Hi when a detection target exists (the light-beam interrupted state: a detection target exists). Based on these output signals, it is determined whether a detection target exists or not.

In (A) the case where power supply line 133 of light receiver 104 is disconnected, electric power for outputting output signal OUT1 and output signal OUT2 is not supplied. Accordingly, irrespective of the presence or absence of a detection target, each of output signal OUT1 and output signal OUT2 is maintained at Low. In this state, the value of output signal OUT1 and the value of output signal OUT2 are not inverted from each other. Thus, it can be detected that an abnormality occurs.

In (B) the case where ground line 134 of light receiver 104 is disconnected, electric power is not supplied to light receiver 104. Accordingly, transistor 462 and transistor 466 each are brought into a non-conducting state, so that each of output signal OUT1 and output signal OUT2 is set at Low. Thus, the value of output signal OUT1 and the value of output signal OUT2 are not inverted from each other between Hi and Low. Thus, it can be detected that an abnormality occurs.

In (C) the case where first signal line 135 is disconnected, the circuit for output signal OUT1 is opened. Accordingly, each of output signal OUT1 and output signal OUT2 is at Low. Thus, the value of output signal OUT1 and the value of output signal OUT2 are not inverted from each other between Hi and Low. Thus, it can be detected that an abnormality occurs.

In (ID) the case where second signal line 136 is disconnected, the circuit for output signal OUT2 is opened. Accordingly, when a detection target does not exist (no detection target exists), output signal OUT1 is at Hi and output signal OUT2 is at Low. On the other hand, when a detection target exists (a detection target exists), each of output signal OUT1 and output signal OUT2 is at Low. When a detection target does not exist, the same values are combined as those in the normal condition. Accordingly, no detection can be done in this state. However, when the detection state is changed, the value of output signal OUT1 and the value of output signal OUT2 are not inverted from each other between Hi and Low. Thus, it can be detected that an abnormality occurs.

As described above, an abnormality can be detected even when disconnection occurs in any conductive wire connected to light receiver 104. The same relation is established even when the logic shown in FIG. 4 is reversed. In this case, in the table, output signal OUT1 only has to be replaced with output signal OUT2 and output signal OUT2 only has to be replaced with output signal OUT1.

In contrast, disconnection occurring in the conductive wire connected to light emitter 102 cannot be detected as an abnormality. Specifically, in each of (E) the case where power supply line 131 of light emitter 102 is disconnected and (F) the case where ground line 132 of light emitter 102 is disconnected, light beam 8 is not applied from light emitter 102. In this state, it cannot be distinguished in light receiver 104 whether light beam 8 is interrupted due to existence of a detection target or light beam 8 is not applied from light emitter 102. This state remains unchanged irrespective of presence or absence of a detection target.

In other words, even when light beam 8 cannot be applied due to some defect occulting in a path through which electric power is supplied to light emitter 102, light receiver 104 outputs output signal OUT1 and output signal OUT2 corresponding to the light-beam interrupted state. Thus, the normal state and the abnormal state cannot be distinguished from each other. In other words, an abnormality cannot be detected even when the detection state changes.

Transmission-type photoelectric sensor 1 according to the present embodiment provides a configuration that allows detection of disconnection that may occur in a conductive wire connected to light emitter 102, as described above.

D. Configuration for Solving Problems (I)

Then, an example of the wiring configuration of photoelectric sensor 1 according to the present embodiment will be described.

Figure 5:
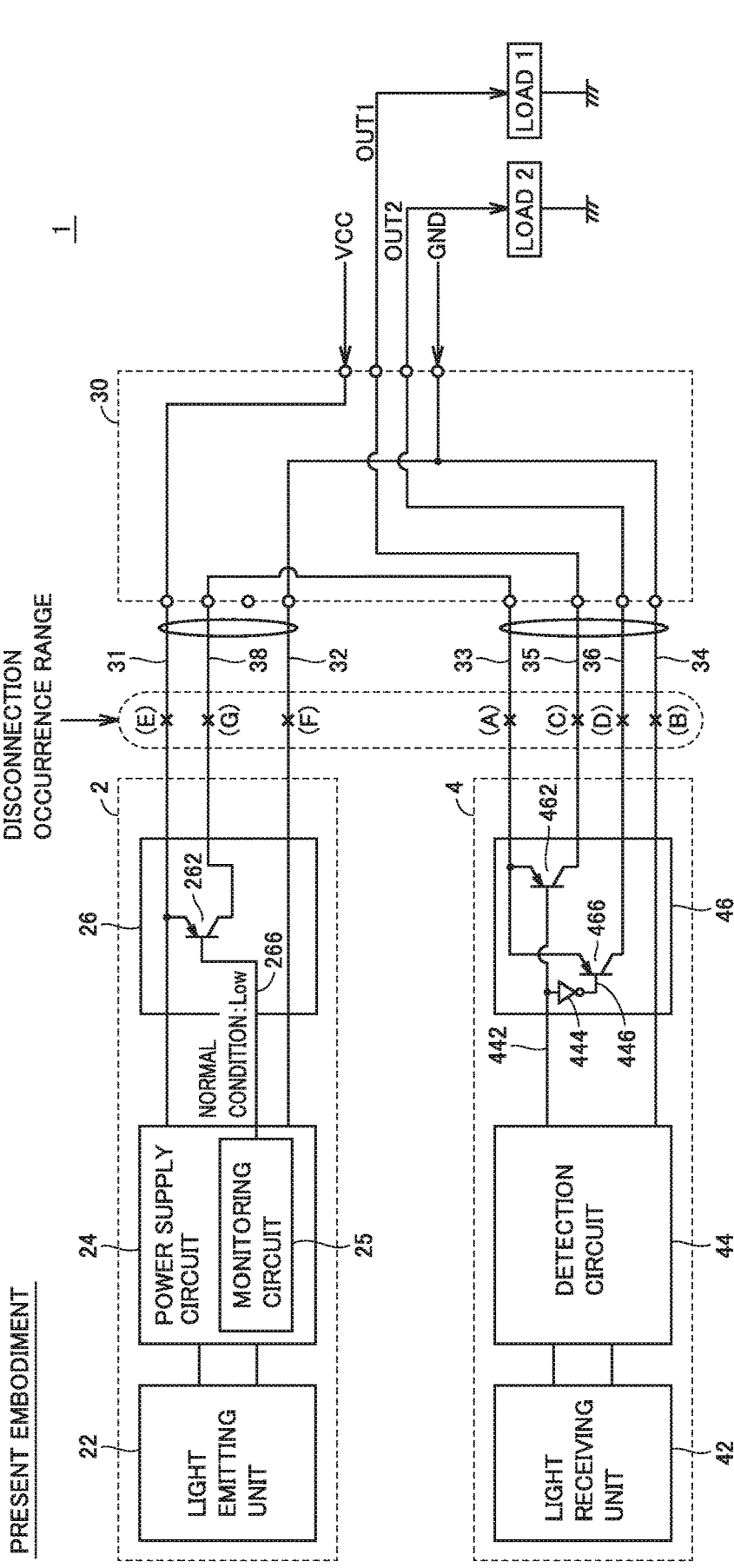
FIG. 5 is a schematic diagram showing an example of the wiring configuration of the photoelectric sensor according to the present embodiment.

FIG. 5 is a schematic diagram showing an example of the wiring configuration of photoelectric sensor 1 according to the present embodiment. Referring to FIG. 5, photoelectric sensor 1 according to the present embodiment includes a light emitter 2 and a light receiver 4, each of which supplies electric power and outputs a signal through a connection unit 30.

Photoelectric sensor 1 according to the present embodiment outputs two signals that are inverted from each other as detection signals. By using these two signals inverted from each other, a defect that may occur not only in light receiver 4 but also in light emitter 2 can be detected. The method of detecting such a defect will be described later in detail. Light emitter 2 includes a signal output circuit 26 in addition to light emitting unit 22 and power supply circuit 24. Signal output circuit 26 serves to output a signal in accordance with the state of light emitter 2.

In the wiring configuration of light emitter 2, power supply potential VCC supplied to connection unit 30 is input into signal output circuit 26 of light emitter 2 through power supply line 31, and is also connected to one end of power supply circuit 24. Ground potential GND supplied to connection unit 30 is input into signal output circuit 26 of light emitter 2 through ground line 32 and also connected to the other end of power supply circuit 24. In other words, power supply circuit 24 of light emitter 2 receives supply of electric power through power supply line 31 (the first power supply line) and ground line 32, each of which leads to the outside of light emitter 2. In photoelectric sensor 1 according to the present embodiment, power supply line 31 and ground line 32 extend to connection unit 30.

A transistor 262 is connected to power supply potential VCC to be supplied to signal output circuit 26.

Power supply circuit 24 alight emitter 2 includes a monitoring circuit 25 that is also operated with electric power supplied through power supply line 31 (the first power supply line) and ground line 32. A drive line 266 is disposed between the gate of transistor 262 and monitoring circuit 25. Monitoring circuit 25 controls the conducting state of transistor 262 (the third switching element). In other words, monitoring circuit 25 activates or deactivates drive line 266 in accordance with the state of light emitter 2. More specifically, monitoring circuit 25 maintains drive line 266 in the activated state as long as light emitter 2 is in a sound state or as long as electric power is supplied to power supply circuit 24.

In the wiring configuration of light receiver 4, a secondary power supply line 38 is connected to a power supply line 33 of light receiver 4 in connection unit 30. In other words, power supply potential VCC supplied to signal output circuit 26 passes through transistor 262 of signal output circuit 26, and thereafter is supplied to signal output circuit 46 through secondary power supply line 38 and power supply line 33. In this way, light receiver 4 includes transistor 262 (the third switching element) disposed between one end of secondary power supply line 38 (the third power supply line) and power supply line 31 (the first power supply line).

Since the circuit configuration of signal output circuit 46 of light receiver 4 and the wiring configuration between first signal line 35 and second signal line 36 are the same as those in FIG. 3 as described above, the detailed description thereof will not be repeated.

As shown in FIG. 5, photoelectric sensor 1 is provided with secondary power supply line 38 (the third power supply line) that has: one end electrically connected to power supply line 31 (the first power supply line) on the inside of light emitter 2; and the other end electrically connected to power supply line 33 (the second power supply line) on the outside of light receiver 4. Power supply line 33 (the second power supply line) and ground line 34 extend to connection unit 30. By employing such a configuration, the accuracy of detecting an abnormality such as disconnection can be increased as compared with the related art described above.

In controller 6 (see FIG. 1), occurrence or non-occurrence of an abnormality can be detected based on the combination of the value of output signal OUT1 and the value output signal OUT2. An example of such an abnormality to be detected may be disconnection that occurs in a conductive wire connecting connection unit 30 to light emitter 2 or light receiver 4, as described above.

The following is an explanation about the function of detecting disconnection in photoelectric sensor 1 shown in FIG. 5. FIG. 6 is a diagram showing changes in output signals at the time when disconnection occurs in photoelectric sensor 1 according to the present embodiment. FIG. 6 shows the output results of output signal OUT1 and output signal OUT2 in the each of state where a detection target does not exist (the light-beam incident state) and the state where a detection target exists (the light-beam interrupted state) with regard to each of the normal state where no disconnection occurs; (A) the case where power supply line 33 of light receiver 4 is disconnected; (B) the case where ground line 34 of light receiver 4 is disconnected; (C) the case where first signal line 35 is disconnected; (D) the case where second signal line 36 is disconnected; (E) the case where power supply line 31 of light emitter 2 is disconnected; (F) the case where ground line 32 of light emitter 2 is disconnected; and (G) the case where secondary power supply line 38 of light emitter 2 is disconnected.

As shown in FIG. 6, in the normal state where no disconnection occurs, photoelectric sensor 1 according to the present embodiment can determine whether a detection target exists or not based on output signal OUT1 and output signal OUT2, as in photoelectric sensor 101 according to the related art as described above.

Also as shown in FIG. 6, photoelectric sensor 1 according to the present embodiment can detect that an abnormality occurs in each of: (A) the case where power supply line 33 of light receiver 4 is disconnected; (B) the case where ground line 34 of light receiver 4 is disconnected; (C) the case where first signal line 35 is disconnected; and (D) the case where second signal line 36 is disconnected, as in photoelectric sensor 101 according to the related art as described above.

Furthermore, photoelectric sensor 1 according to the present embodiment can detect that an abnormality occurs in each of (E) the case where power supply line 3 of light emitter 2 is disconnected; and (F) ground line 32 of light emitter 2 is disconnected, in contrast to photoelectric sensor 101 according to the related art as described above.

More specifically, in (E) the case where power supply line 31 of light emitter is disconnected, electric power is not supplied to light emitter 2 and light receiver 4. Thus, there is no electric power for outputting output signal OUT1 and output signal OUT2. As a result, each of output signal OUT1 and output signal OUT2 is maintained at Low irrespective of the presence or absence of a detection target. It this state, the value of output signal OUT1 and the value of output signal OUT2 are not inverted from each other. Thus, it can be detected that an abnormality occurs.

In (F) the case where ground line 32 of light emitter 2 is disconnected, electric power is not supplied to power supply circuit 24 of light emitter 2. Accordingly, monitoring circuit 25 for activating transistor 262 also stops operating. This results in interruption of a path through which electric power is supplied via secondary power supply line 38 to light receiver 4. Thus, each of output signal OUT1 and output signal OUT2 is maintained at Low irrespective of the presence or absence of a detection target. In this state, the value of output signal OUT1 and the value of output signal OUT2 are not inverted from each other. Thus, it can be detected that an abnormality occurs.

Photoelectric sensor 1 according to the present embodiment is different from photoelectric sensor 101 shown in FIG. 3 in that secondary power supply line 38 is added as a conductive wire that connects connection unit 30 and light emitter 2. Although this secondary power supply line 38 also may be disconnected, such disconnection of secondary power supply line 38 can also be detected.

In (G) the case where secondary power supply line 38 of light emitter 2 is disconnected, the power supply path from light emitter 2 to light receiver 4 is to be interrupted. Thus, each of output signal OUT1 and output signal OUT2 is maintained at Low irrespective of the presence or absence of a detection target. In this state, the value of output signal OUT1 and the value of output signal OUT2 are not inverted from each other. Thus, it can be detected that an abnormality occurs.

The same relation is established even when the logic shown in FIG. 6 is reversed. In this case, in the table, output signal OUT1 only has to be replaced with output signal OUT2, and output signal OUT2 only has to be replaced with output signal OUT1.

As described above, photoelectric sensor 1 according to the present embodiment can reliably detect an abnormality even when disconnection occurs in any of the conductive wire that connects connection unit 30 and light emitter 2; and the conductive wire that connects connection unit 30 and light receiver 4.

E. Modifications

Modifications as described below can also be applied in photoelectric sensor 1 according to the present embodiment as described above.

(e1: Monitoring Circuit)

Monitoring circuit 25 of power supply circuit 24 shown in FIG. 5 may be configured to more precisely monitor the state of light emitter 2. Examples of conceivable situations may be: a situation where the lens surface (a surface onto which a light beam is applied) of light emitting unit 22 of light emitter 2 is stained; and a situation where the amount of light flux from a light emitting element that forms light emitting unit 22 is reduced due to the end of its lifespan. Monitoring circuit 25 may include a function of detecting such an abnormal situation.

Figure 7:
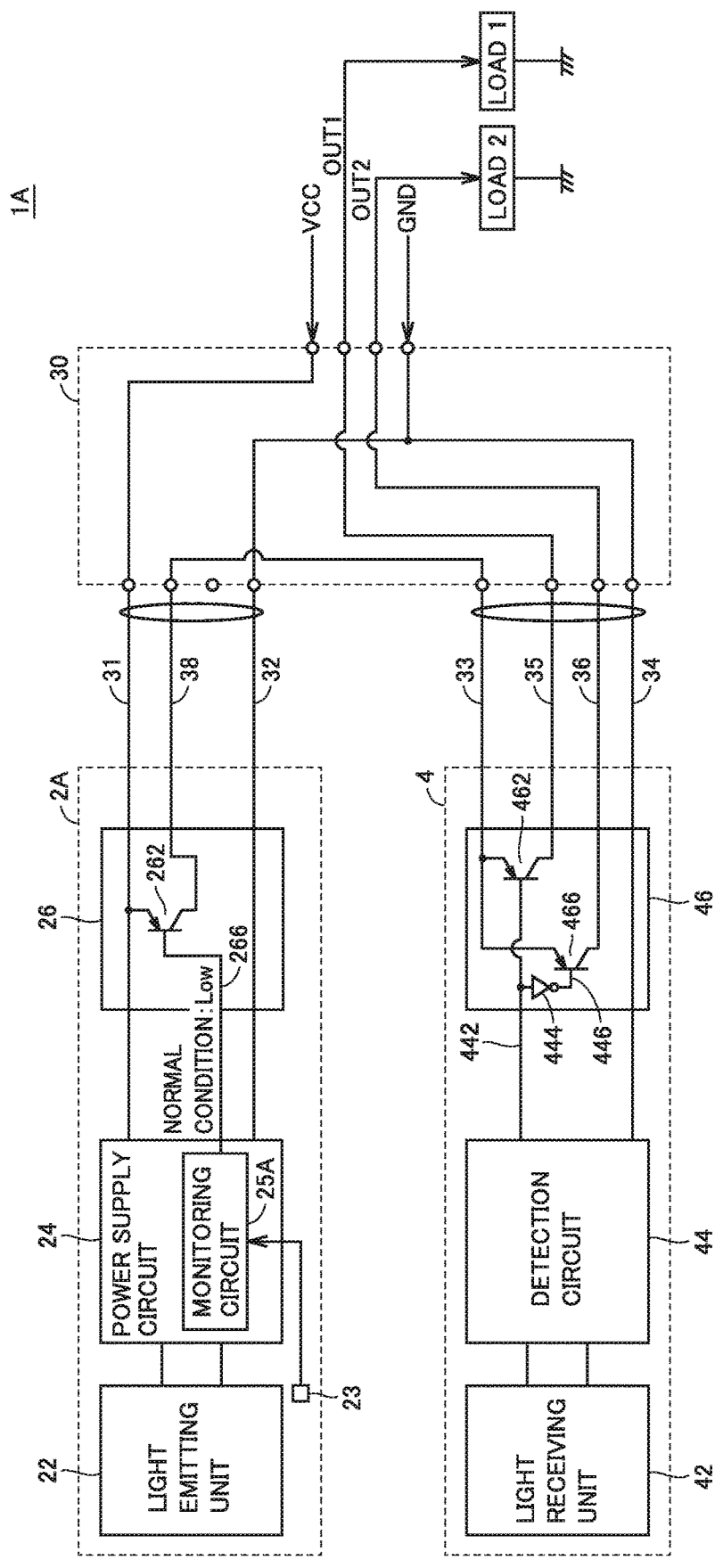
FIG. 7 is a schematic diagram showing an example of the wiring configuration of a photoelectric sensor according to the first modification of the present embodiment.

FIG. 7 is a schematic diagram showing an example of the wiring configuration of a photoelectric sensor 1A according to the first modification of the present embodiment. Referring to FIG. 7, photoelectric sensor 1A according to the first modification of the present embodiment includes a light-beam applying state detection sensor 23 that is disposed in close proximity to light emitting unit 22 of light emitter 2A. Light-beam applying state detection sensor 23 corresponds to a detector that monitors the state of light beam 8 applied from light emitting unit 22. More specifically, light-beam applying state detection sensor 23 is formed of a photodiode and the like and configured to determine whether or not the intensity or the illuminance of light beam 8 applied from light emitting unit 22 of light emitter 2A is equal to or greater than a prescribed value, and then, output the detection result to a monitoring circuit 25A.

Monitoring circuit 25A maintains transistor 262 (the third switching element) in the conducting state when light beam 8 is applied in a predetermined state. More specifically, monitoring circuit 25A shifts drive line 266 to a non-active state (Low) when the detection result from light-beam applying state detection sensor 23 shows that the intensity of light beam 8 is less than a prescribed value even though prescribed electric power is supplied from power supply circuit 24 to light emitting unit 22. This brings transistor 262 into a non-conducting state, so that a path through which electric power is supplied to light receiver 4 is interrupted. As a result, irrespective of the presence or absence of a detection target, each of output signal OUT1 and output signal OUT2 is set at Low, which is to be detected as an abnormality.

FIG. 7 shows an example of monitoring the intensity of light beam 8 applied from light emitting unit 22 of light emitter 2A as a representative example. Without being limited to this example, any state of light emitter 2 may be monitored. Examples of a target to be monitored may be the ambient temperature, the internal temperature, the quality of the external power supply (a voltage value, a voltage change rate, and the like), the capacitance of an electrolytic capacitor mounted in power supply circuit 24, and the like.

Furthermore, the voltage of a light emitting circuit may be monitored. Breakdown to open of a light emitting element such as an LED causes a decrease in the drive voltage of the light emitting circuit. Thus, while monitoring such a voltage decrease, the output signal from a light emitter may be set at Low.

(e2: Simplified Configuration)

Photoelectric sensor 1 according to the present embodiment as described above employs a configuration in which an abnormality such as disconnection is detected by disposing light emitter 2 and light receiver 4 so as to be involved in a portion of the path until which output signal OUT1 and output signal OUT2 are output. Under such a technical idea, the circuit configuration in light emitter 2 may be further simplified. The following is an explanation about an example in which the circuit configuration of light emitter 2 is simplified.

Figure 8:
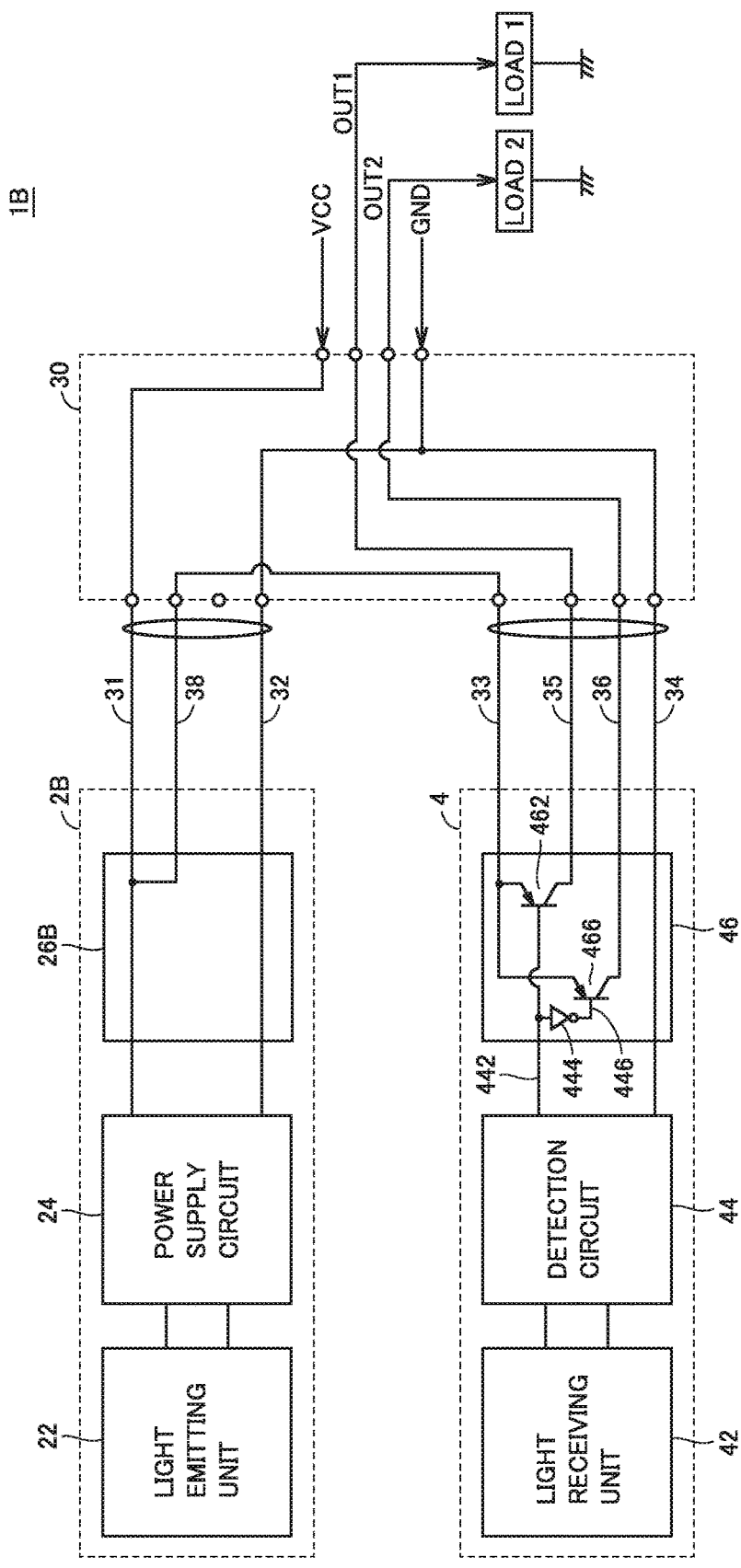
FIG. 8 is a schematic diagram showing an example of the wiring configuration of a photoelectric sensor according to the second modification of the present embodiment.

FIG. 8 is a schematic diagram showing an example of the wiring configuration of a photoelectric sensor 1B according to the second modification of the present embodiment. Referring to FIG. 8, in photoelectric sensor 1B according to the second modification of the present embodiment, the circuit configuration of a signal output circuit 26B of a light emitter 2B is simplified. More specifically, transistor 262 and the like are not provided and one end of secondary power supply line 38 is electrically connected to power supply line 31. In even such a simple circuit configuration, disconnection occurring in power supply line 31 and the like can be detected.

(e3: Short-Circuit Detecting Function)

The above description has been made with regard to the function of detecting disconnection that may occur in the conductive wire that connects connection unit 30 to light emitter 2 or light receiver 4, but a short circuit that may occur between these conductive wires can also be detected.

In general, a short circuit between the conductive wire related to power supply potential VCC and the conductive wire related to ground potential GND can be detected based on the level of the amount of supplied current and the like. Also, in the case of a short circuit between the conductive wire related to power supply potential VCC or ground potential GND and the conductive wire related to output signal OUT1 or output signal OUT2, output signal OUT1 or output signal OUT2 usually shows a value in accordance with the current situation. Accordingly, occurrence of an abnormality can be detected based on the values of output signal our and output signal OUT2.

Furthermore, one or both of signal output circuit 26 of light emitter 2 and signal output circuit 46 of light receiver 4 may be provided with an additional circuit for facilitating detection of a short circuit.

(e4: Light-Beam Interruption Command Input)

In the configuration of the photoelectric sensor shown in each of FIGS. 5, 7 and 8 as described above, the number of conductive wires connecting each of light emitters 2, 2A and 2B to connection unit 30 is three, which is smaller by one than four conductive wires that connect light receiver 4 to connection unit 30. It is reasonable and economical that the cable containing a number of conductive wires from connection unit 30 to each of light emitters 2, 2A and 2B is identical in specifications to the cable containing a number of conductive wires from connection unit 30 to tight receiver 4. In the above-described example, a path from connection unit 30 to each of light emitters 2, 2A, 2B and Eight receiver 4 may be connected by a cable including four conductive wires.

When such a cable including four conductive wires is employed, remaining one conductive wire may be used for another use purpose for light emitters 2, 2A and 2B.

By way of example, controller 6 and the like may issue a command to control the timing and the state for applying light beam 8 from light emitters 2, 2A and 2B. Examples of a conceivable command may be a command to mask light beam 8 applied from each of light emitters 2, 2A and 2B when a command from controller 6 is activated (a light-beam interruption command input). Using such a light-beam interruption command input can prevent erroneous detection of a detection target during a certain operation and the like.

(e5: Output Signal)

The above description has been made while exemplifying the configuration in which output signal OUT1 and output signal OUT2 have values that are inverted from each other, but the present invention is not necessarily limited to this configuration. For example, output signal OUT1 and output signal OUT2 having the same value may be adopted. Furthermore, a signal of a predetermined operating frequency may be output as a single output signal.

In the case where output signal OUT1 and output signal OUT2 having the same value are adopted, disconnection occurring in a signal line results in outputting of output signal OUT1 and output signal OUT2 having different values. Thus, an abnormality can be detected. For example, when one of the lines is disconnected in the state where output signal OUT1 is at Low and output signal OUT2 is at Low, an abnormality cannot be detected since both the signals remain at Low. However, an abnormality can be detected when the state of the detection target changes.

F. Advantage

According to the photoelectric sensor in the present embodiment, even disconnection occurring in any of the light emitter and the light receiver can be reliably detected only by adding one conductive wire between the connection unit and the light emitter, as compared with the photoelectric sensor according to the related art.

According to the photoelectric sensor in the present embodiment, occurrence or non-occurrence of an abnormality can be detected in real time based on the combination of the values of the output signals. Accordingly, a complicated logic and the like for detecting an abnormality do not need to be mounted in a controller and the like.

According to the photoelectric sensor in the present embodiment, an abnormality inside the light emitter can also be detected in addition to an abnormality caused by occurrence of disconnection in the conductive wire from the connection unit to the light emitter. For example, by employing the light-beam applying state detection sensor as described above, it becomes possible to detect the state where a light beam cannot be appropriately applied, which occurs in the cases where the amount of light flux from a light emitting element is reduced due to the end of its lifespan, or where a lens is stained. Thus, this abnormal state can be output to the outside.

In general, in the case of employing the configuration for checking the normal operation at any timing using an input line such as termination of light beam emission, a total of five terminals for a power supply line, a ground line, a light emitter input line, a light receiver signal line, and a light receiver signal line are required. However, the photoelectric sensor according to the present embodiment requires only four terminals, so that ports can be effectively utilized with efficiency.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1, 1A, 1B, 101 photoelectric sensor, 2, 2A, 2B, 102 light emitter, 4, 104 light receiver, 6 controller, 8 light beam, 10 conveyor, 12 workpiece, 22 light emitting unit, 23 light-beam applying state detection sensor, 24, 124 power supply circuit, 25, 25A monitoring circuit, 26, 26B, 46 signal output circuit, 30, 130 connection unit, 31, 33, 131, 133 power supply line, 32, 34, 132, 134 ground line, 35, 135 first signal line, 36, 136 second signal line, 38 secondary power supply line, 42 light receiving unit, 44 detection circuit, 262, 462, 466 transistor, 266, 442, 446 drive line, 444 inverting circuit, GND ground potential, OUT1, OUT2 output signal.

The invention claimed is:

1. A photoelectric sensor comprising a light emitter and a light receiver that are separated from each other,
the light emitter comprising:
a light emitting unit configured to emit a light beam; and
a power supply circuit configured to
receive supply of electric power through a first power supply line leading to an outside of the light emitter, and
supply required electric power to the light emitting unit,
the light receiver comprising:
a first switching element, connected to a second power supply line leading to an outside of the light receiver, for serving to output a first output signal,
a second switching element, connected to the second power supply line, for serving to output a second output signal; and
a detection circuit configured to switch a conducting state of each of the first switching element and the second switching element in accordance with an intensity of light detected, wherein
a third power supply line is provided such that one end of the third power supply line is electrically connected to the first power supply line inside the light emitter, and the other end of the third power supply line is electrically connected to the second power supply line outside the light receiver, and
the light emitter further comprises:
a third switching element disposed between the one end of the third power supply line and the first power supply line; and
a monitoring circuit configured to control a conducting state of the third switching element.

2. The photoelectric sensor according to claim 1, wherein the monitoring circuit is configured to operate with electric power supplied through the first power supply line.

3. The photoelectric sensor according to claim 1, wherein the light emitter further comprises a detector configured to monitor a state of the light beam applied from the light emitting unit, and
the monitoring circuit is configured to maintain the third switching element in the conducting state when the light beam is applied in a predetermined state.

4. The photoelectric sensor according to claim 1, further comprising a connection unit through which electric power is input from an external power supply and through which the first output signal and the second output signal are output, wherein
the first power supply line extends from the light emitter to the connection unit, and
the second power supply line extends from the light receiver to the connection unit.

5. The photoelectric sensor according to claim 1, wherein the detection circuit is configured to switch the first switching element and the second switching element to be brought into conducting states different from each other in accordance with the intensity of light detected.

6. A photoelectric sensor comprising a light emitter and a light receiver that are separated from each other,
the light emitter comprising:
a light emitting unit configured to emit a light beam; and
a power supply circuit configured to
receive supply of electric power through a first power supply line and a second power supply line leading to an outside of the light emitter, and
supply required electric power to the light emitting unit, one end of a third power supply line being connected to the first power supply line inside the light emitter, and
the light receiver comprising:
a first switching element, connected to the other end of the third power supply line, for serving to output a first output signal;
a second switching element, connected to the other end of the third power supply line, for serving to output a second output signal; and
a detection circuit configured to switch a conducting state of each of the first switching element and the second switching element in accordance with an intensity of light detected.

7. The photoelectric sensor according to claim 6, further comprising a connection unit through which electric power is input from an external power supply and through which the first output signal and the second output signal are output, wherein
the first power supply line extends from the light emitter to the connection unit, and
the second power supply line extends from the light receiver to the connection unit.

8. The photoelectric sensor according to claim 6, wherein the detection circuit is configured to switch the first switching element and the second switching element to be brought into conducting states different from each other in accordance with the intensity of light detected.

9. A light emitter combined with a light receiver to form a photoelectric sensor, the light emitter and the light receiver being separated from each other, the light emitter comprising:
a light emitting unit configured to emit a light beam; and
a power supply circuit configured to
receive supply of electric power through a first power supply line leading to an outside of the light emitter, and
supply required electric power to the light emitting unit, the light receiver comprising:
a first switching element, connected to a second power supply line leading to an outside of the light receiver, for serving to output a first output signal;
a second switching element, connected to the second power supply line, for serving to output a second output signal; and
a detection circuit configured to switch a conducting state of each of the first switching element and the second switching element in accordance with an intensity of light detected, wherein
a third power supply line is provided such that one end of the third power supply line is electrically connected to the first power supply line inside the light emitter, and the other end of the third power supply line is electrically connected to the second power supply line outside the light receiver, and
the light emitter further comprises:
a third switching element disposed between the one end of the third power supply line and the first power supply line; and
a monitoring circuit configured to control a conducting state of the third switching element.

10. The light emitter according to claim 9, wherein the monitoring circuit is configured to operate with electric power supplied through the first power supply line.

11. The light emitter according to claim 9, further comprising a detector configured to monitor a state of the light beam applied from the light emitting unit, wherein
the monitoring circuit is configured to maintain the third switching element in the conducting state when the light beam is applied in a predetermined state.

12. The light emitter according to claim 9, wherein
electric power is input from an external power supply through a connection unit and the first output signal and the second output signal are output through the connection unit,
the first power supply line extends from the light emitter to the connection unit, and
the second power supply line extends from the light receiver to the connection unit.

13. The light emitter according to claim 9, wherein the detection circuit is configured to switch the first switching element and the second switching element to be brought into conducting states different from each other in accordance with the intensity of light detected.

14. A light emitter combined with a light receiver to form a photoelectric sensor, the light emitter and the light receiver being separated from each other, the light emitter comprising:
a light emitting unit configured to emit a light beam; and
a power supply circuit configured to
receive supply of electric power through a first power supply line and a second power supply line leading to an outside of the light emitter, and
supply required electric power to the light emitting unit, one end of a third power supply line being connected to the first power supply line inside the light emitter,
the light receiver comprising:
a first switching element, connected to the other end of the third power supply line, for serving to output a first output signal;
a second switching element, connected to the other end of the third power supply line, for serving to output a second output signal; and
a detection circuit configured to switch a conducting state of each of the first switching element and the second switching element in accordance with an intensity of light detected.

15. The light emitter according to claim 14, wherein
electric power is input from an external power supply through a connection unit and the first output signal and the second output signal are output through the connection unit,
the first power supply line extends from the light emitter to the connection unit, and
the second power supply line extends from the light receiver to the connection unit.

16. The light emitter according to claim 14, wherein the detection circuit is configured to switch the first switching element and the second switching element to be brought into conducting states different from each other in accordance with the intensity of light detected.

* * * * *